(12) United States Patent
Tramoni

(10) Patent No.: US 10,454,530 B2
(45) Date of Patent: Oct. 22, 2019

(54) FREQUENCY ADJUSTMENT OF AN NFC CIRCUIT

(71) Applicant: STMicroelectronics (Rousset) SAS, Rousset (FR)

(72) Inventor: Alexandre Tramoni, Le Beausset (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 16/102,068

(22) Filed: Aug. 13, 2018

(65) Prior Publication Data

US 2019/0068245 A1 Feb. 28, 2019

(30) Foreign Application Priority Data

Aug. 25, 2017 (FR) ...................................... 17 57883

(51) Int. Cl.
*H04W 4/80* (2018.01)
*H04B 5/00* (2006.01)
*H03H 7/38* (2006.01)

(52) U.S. Cl.
CPC ......... *H04B 5/0012* (2013.01); *H04B 5/0031* (2013.01); *H04B 5/0056* (2013.01); *H04B 5/0062* (2013.01); *H04B 5/0081* (2013.01); *H03H 7/38* (2013.01)

(58) Field of Classification Search
CPC ........................... H04B 5/0012; H04B 5/0031
See application file for complete search history.

(56) References Cited

U.S. PATENT DOCUMENTS

| 2014/0227978 | A1 | 8/2014 | Ikeda et al. | |
|---|---|---|---|---|
| 2016/0008602 | A1* | 1/2016 | Perryman | H02J 50/20 607/61 |
| 2017/0017606 | A1* | 1/2017 | Meneau | G06F 1/3287 |
| 2017/0214434 | A1* | 7/2017 | Hong | H04B 1/3888 |

FOREIGN PATENT DOCUMENTS

| AU | 2007214347 A1 | 3/2009 |
|---|---|---|
| WO | 2011079599 A1 | 7/2011 |

* cited by examiner

*Primary Examiner* — Tuan H Nguyen
(74) *Attorney, Agent, or Firm* — Slater Matsil, LLP

(57) ABSTRACT

A near-field communication circuit includes an oscillating circuit having a controllable capacitor. A control circuit is coupled to the oscillating circuit to control the controllable capacitor. A battery is coupled to the control circuit to enable control when the near-field communication circuit is in a standby mode. The near-field communication circuit can be utilized by a mobile communication device.

17 Claims, 2 Drawing Sheets

FREQUENCY ADJUSTMENT OF AN NFC CIRCUIT

CROSS-REFERENCE TO RELATED APPLICATIONS

This application claims priority to French Patent Application No. 1757883, filed on Aug. 25, 2017, which application is hereby incorporated herein by reference.

TECHNICAL FIELD

The present disclosure generally relates to electronic circuits and, in specific embodiments, to electromagnetic transponders or electronic tags (TAG).

BACKGROUND

Communication systems with electromagnetic transponders are more and more frequent, particularly since the development of near-field communication (NFC) technologies.

Such systems use a radio frequency electromagnetic field with a device (terminal or reader) to communicate with another device (card).

To optimize the quality of the communication, the resonance frequency of an oscillating circuit of the device detecting a field is generally adjusted due to capacitive elements having a settable value.

In recent systems, the same NFC device may operate in card mode or in reader mode (for example, in the case of a near-field communication between two cellular phones). It is then frequent for devices to be powered with a battery and for their functions and circuits to be set to standby to avoid consuming power between periods of use.

The devices then have to be "woken up" when they are within each other's range. The field detection should however be operative in standby mode.

SUMMARY

The present disclosure relates to electromagnetic transponders or electronic tags (TAG). Specific embodiments of the present disclosure apply to electronic devices integrating a near-field communication circuit (NFC) and to the frequency adjustment of the oscillating circuit of such devices.

Embodiments can decrease all or part of the disadvantages of known techniques of adjustment of the resonance frequency of an oscillating circuit of a NFC device.

Embodiments provide a solution that adapted to an operation in standby mode.

Thus, an embodiment provides a near-field communication circuit comprising an oscillating circuit having a controllable capacitor controlled by circuit elements, powered by a battery when the circuit is at standby.

According to an embodiment, the circuit comprises a controllable resistive dividing bridge powered by the battery and having an output controlling the controllable capacitor.

According to an embodiment, the capacitor is controlled based on stored data representative of the frequency tuning of the oscillating circuit based on a measurement performed before the circuit is set to standby.

According to an embodiment, the bridge is controlled according to the data.

According to an embodiment, the resistive bridge is controlled by a latch circuit powered by the battery.

According to an embodiment, the data are stored in a register having the states of its bits conditioning the states supplied by the latch.

According to an embodiment, the data are obtained from an analysis of the amplitude and of the phase of the signal across the oscillating circuit.

According to an embodiment, the bridge comprises a first resistor connected between a first terminal of application of a voltage supplied by the battery and an output terminal connected to a control terminal of the controllable capacitor. The bridge also comprises second resistors, each in series with a switch between the output terminal and a second terminal of application of the voltage supplied by the battery.

An embodiment relates to a method of controlling a controllable capacitor of an oscillating circuit of a near-field communication circuit, wherein the capacitor is controlled during standby periods of the near-field communication circuit according to data measured before the circuit is at standby.

An embodiment provides a mobile communication device comprising a near-field communication circuit.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
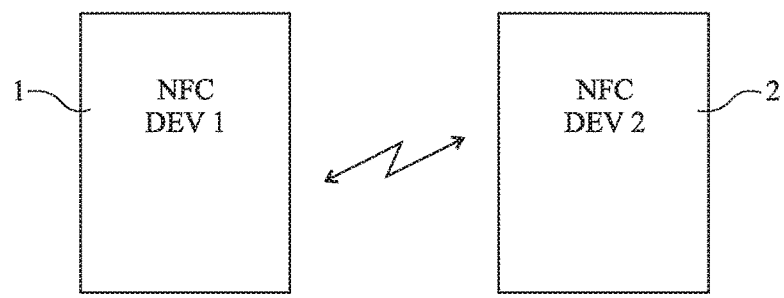
FIG. 1 is a very simplified representation in the form of blocks of an example of a near-field communication system of the type to which the embodiments which will be described apply as an example.

The same elements have been designated with the same reference numerals in the different drawings.

For clarity, only those steps and elements which are useful to the understanding of the embodiments which will be described have been shown and will be detailed. In particular, the generation of the radio frequency signals and their interpretation has not been detailed, the described embodiments being compatible with usual techniques of generation and interpretation of these signals.

Unless otherwise specified, when reference is made to two elements connected together, this means directly connected with no intermediate element other than conductors, and when reference is made to two elements coupled together, this means that the two elements may be directly coupled (connected) or coupled via one or a plurality of other elements.

In the following description, when reference is made to terms "approximately", "about", and "in the order of", this means to within 10%, preferably to within 5%.

FIG. 1 is a very simplified representation in the form of blocks of an example of a near-field communication system of the type to which the embodiments which will be described apply as an example.

Although the case of two similar electronic devices, for example, two cellular phones, is assumed, all that will be described more generally applies to any system where a transponder detects an electromagnetic field radiated by a reader or terminal. For simplification, reference will be made to NFC devices to designate electronic devices integrating near-field communication circuits.

Two NFC devices 1 (NFC DEV1) and 2 (NFC DEV2) are capable of communicating by near-field electromagnetic coupling. According to applications, for a communication, one of the devices operates in so-called reader mode while the other operates in so-called card mode, or the two devices communicate in peer to peer mode (P2P). Each device comprises various electronic circuits, including a circuit forming a near-field communication interface (NFC interface) between the NFC device and the outside. This interface is used, among others, in reader mode, to generate a radio frequency signal transmitted by an antenna and, in card mode, to decode a detected radio frequency signal. The radio frequency field generated by one of the devices is detected by the other device which is located within its range and which also comprises an antenna.

NFC interfaces comprise oscillating circuits that are generally equipped with variable capacitors to improve the communication by correcting possible drifts of the standardized resonance frequency (typically, 13.56 MHz). The capacitor that equips the oscillating circuit generally is a capacitor having a value settable by voltage control. It may be an array of switchable capacitors in parallel or a programmable integrated capacitor PTIC. The control signal originates from a NFC circuit of the interface and is generally analog, a digital-to-analog converter being used. The NFC circuit measures the amplitude and the phase across the oscillating circuit. A microcontroller integrated to the NFC circuit deduces therefrom the tuning frequency of the oscillating circuit and generates a digital control signal, converted by a digital-to-analog converter, to apply an analog signal to the control terminal of the PTIC.

Figure 2:
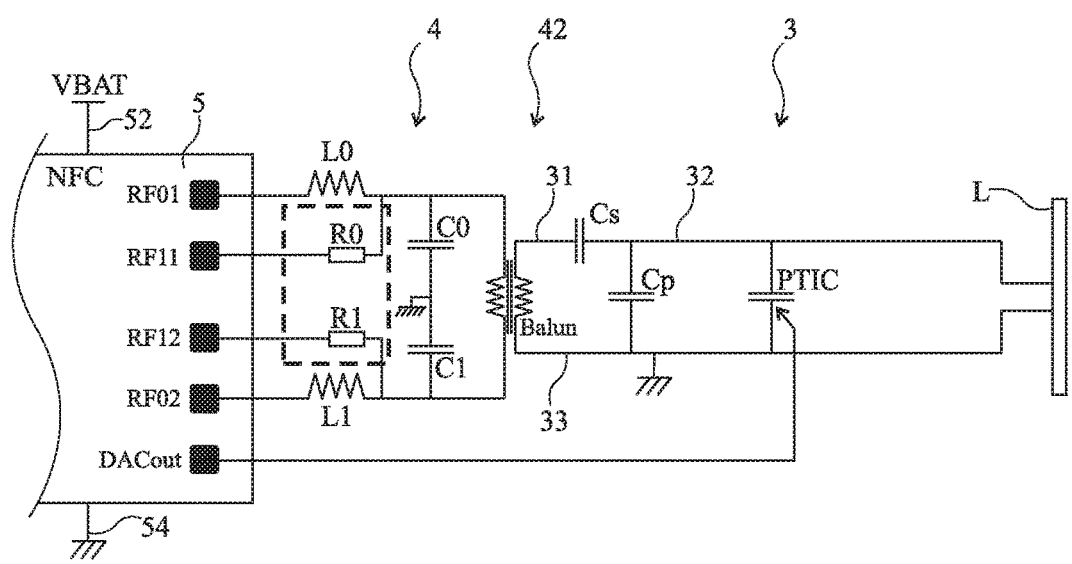
FIG. 2 is a diagram partially illustrating an embodiment of circuits of a near-field communication device.

FIG. 2 is a diagram partially illustrating an embodiment of circuits of a near-field communication device.

To simplify, a NFC interface comprises at least one series and/or parallel resonant circuit 3. In the example of FIG. 2, circuit 3 comprises an inductance L forming an antenna and a capacitive circuit. The capacitive circuit comprises a first capacitor Cs series-connected with antenna L between input-output terminals 31 and 33 of resonant circuit 3, a second capacitor Cp connected in parallel with antenna L between a terminal 32 of connection of capacitor Cs to antenna L and terminal 33, and a voltage-controlled PTIC in parallel with capacitor Cp. If desired, the PTIC may replace capacitor Cp.

In the shown example, the same resonant circuit 3 is used in transmit and in receive mode. In this case, terminals 31 and 33 are coupled to input terminals RFI1 and RFI2 of a radio frequency receive chain of a NFC circuit 5 and to output terminals RFO1 and RFO2 of a radio frequency transmit chain of circuit 5, via various circuits 4 (impedance matcher, branching devices, couplers, mode-switching transformers or balun, etc.). For example, each terminal RFO1, RFO2 is coupled, by a LC filter, to one of the terminals of a first winding of a mode-switching transformer 42 (balun) having the terminals of a second winding connected to terminals 31 and 33. Each LC filter comprises an inductance L0, respectively L1, between terminals RFO1, respectively RFO2, and balun 42, as well as a capacitor C0, respectively C1, between the balun and the ground. In the example of FIG. 2, each terminal RFI1, RFI2 is coupled to the balun by a resistor, respectively R0 or R1, to form in receive mode a RC filter with capacitor C0 or C1.

Capacitor PTIC is controlled by an analog signal (a voltage) supplied by circuit 5 (terminal DACout) which is a function of an evaluation of the coupling, for example, by analysis of the amplitude and of the phase of the signal across the antenna.

The device may comprise two antennas, respectively for emission and for reception. Each transmission chain (emission or reception) then comprises the elements required between the antenna and circuit 5 or the like.

Circuit 5 of course comprises other terminals, among which terminals 52 and 54 of connection to a battery (voltage VBAT) of the NFC device, in particular for an operation in reader mode, terminals of connection to communication buses (data, address, control) internal to the NFC device, etc.

A NFC interface such as illustrated in FIG. 2 has a usual operation.

The circuits of the NFC interface (particularly circuit 5) are generally disconnected from the battery during periods when the NFC device is at standby. Further, when it operates in card mode, circuit 5 can extract the power supply required for its operation from the electromagnetic field where it is located. In practice, in applications targeted by the present description, when a NFC device is not communicating, it is switched to standby to decrease the consumed power. In this case, the setting of the tuning frequency by circuit 5 may not be performed and circuit 5 risks not being woken up in the presence of a field.

Indeed, since the control of capacitor PTIC is performed by the NFC circuit, when the latter is at standby and supposed to be powered by the field detected by the oscillating circuit, the setting only occurs once the circuit is awake. This fulfills the aim during the communication. However, in the absence of a communication, it would be desirable to keep on adjusting the tuning frequency of the oscillating circuit, which may non-negligibly vary according to the environmental conditions (object nearby, user's hand, etc.). This is not compatible with a low-consumption mode since this would require leaving the microcontroller, the digital-to-analog converter, etc. on.

Thus, a difficulty lies in the fact that the power sampled to wake up a NFC device depends on the coupling performed with the emitting device. The coupling factor depends on a plurality of parameters, among which the distance between the two devices, but also on a detuning between the two NFC interfaces (their oscillating circuits). Typically, the tuning frequency of NFC interfaces is 13.56 MHz. However, if one of the interfaces is out of tune, the power that it extracts from the field radiated by the other NFC device may be too low to wake it up.

According to the described embodiments, it is provided to store data representative of a value for adjusting the tuning of oscillating circuit 3 of the device, before setting it to standby, and to use these data while the device is at standby so that it can detect a possible field and be woken up (come out of the standby mode).

Still according to the described embodiments, the circuits required for the tuning adjustment are powered, at least during standby periods, by the device battery. Thus, during standby periods, the tuning may be adjusted. Further, it is not necessary to perform a measurement and the corresponding circuits may be deactivated. Instead of being powered, as in usual NFC devices, by the power extracted from the field once the NFC circuit is "woken up" by the detected field, the resistive array is, at least when the circuit is at standby, powered by the battery.

According to the described embodiments, it is provided to perform, at least during standby periods, this frequency tuning by means of a resistive array assembled as a voltage dividing bridge and having its output connected to the control terminal of the variable capacitive element of the oscillating circuit. The resistive array is controlled from a simplified control circuit, integrated to the NFC interface, but which is different from its microcontroller.

Thus, during standby periods, it is provided to keep the tuning with no digital-to-analog converter and no microcontroller to generate a power consumption which is sufficiently low to be compatible with a standby operating mode, powered by the battery of the NFC device.

Figure 3:
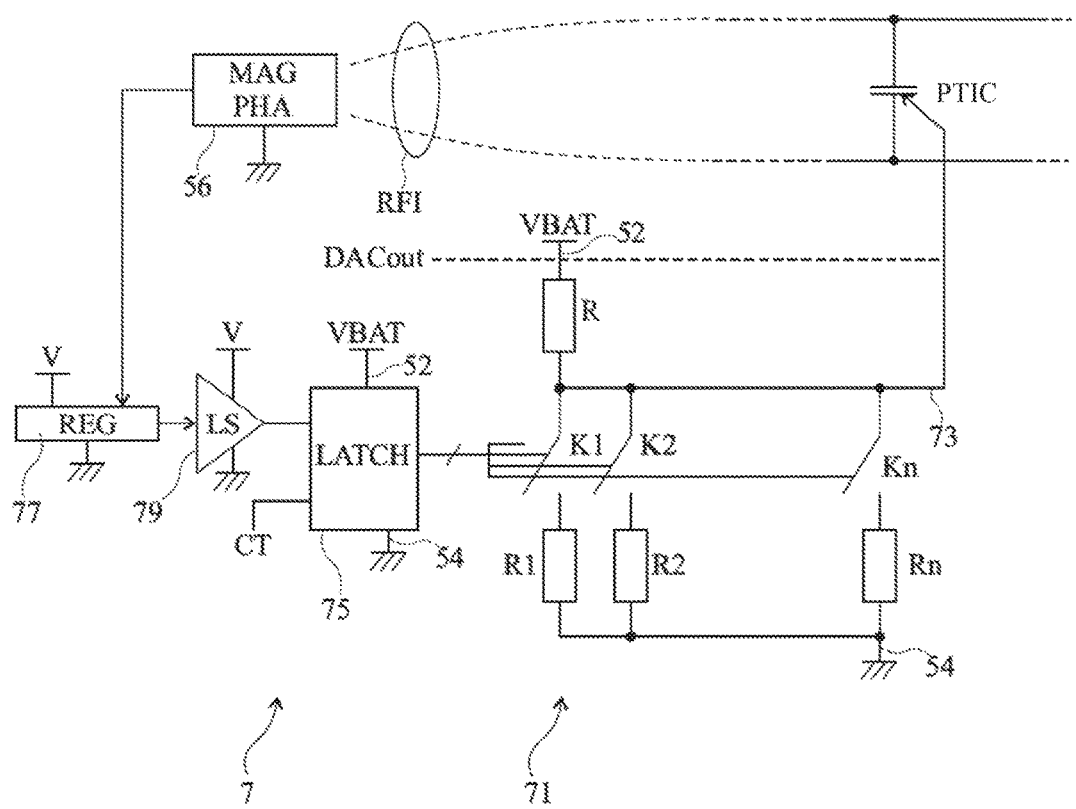
FIG. 3 very schematically shows an embodiment of a NFC interface.

FIG. 3 shows an embodiment of a NFC interface equipped with a simplified control circuit 7.

For simplification, only variable capacitor PTIC of the oscillating circuit and control circuit 7 have been shown, the other circuits of the NFC interface being similar to those described in relation with FIG. 2. In particular, the interface comprises a microcontroller, the various circuits 4, and others.

According to the embodiment of FIG. 3, circuit 7 comprises a multi-resistor dividing bridge 71, between terminals 52 and 54 of application of voltage VBAT comprising, for example, a resistor R between terminal 52 and an output terminal 73 of the bridge, connected to the control terminal of capacitor PTIC, and n resistors R1, R2, . . . , Rn, respectively in series with n switches K1, K2, . . . , Kn, between terminal 73 and ground 54. The n switches K are individually controlled by a latch circuit 75 (LATCH), powered with voltage VBAT. Latches 75 are, for example, of RS type and receive, on their set inputs, bits of a word of a register 77 (REG). A level-shifting circuit 79 (LS) may be interposed between the register output and circuit 75. The reset inputs of the latches receive a signal CT indicative of a standby (or non-standby) state of the interface.

Preferably, outside standby periods (signal CT inactive), all switches K are off and the PTIC is not controlled by resistive bridge 71. Preferably, usual circuits such as the measurement circuits and the digital-to-analog converter supplying an analog signal on terminal DACout are used (FIG. 2). When signal CT is active, switches K are controlled according to the bits of register 77 to place resistors R more or less in parallel. In an embodiment where circuit 7 is integrated to circuit 5 of FIG. 2, it can be considered that output DACout supplies the output of the analog-to-digital converter powered outside standby periods and output 73 of the resistive bridge during standby periods.

The content of register 77 is updated, preferably before each setting to standby, based on an analysis, by a circuit 56 (MAG PHA), of the amplitude and of the phase of the signal present on terminals RFI. Circuit 56 is usual per se and, for example, corresponds to that used by the digital-to-analog converter. It is assumed for this purpose that the circuit is intended to be set to standby each time a communication ends.

As a variation, register 77 is periodically updated, preferably for each measurement performed by circuit 56 outside standby periods. According to another variation, the register is used as an input register by the digital-to-analog converter.

Register 77, its readout circuit (not shown) and circuit 79 are powered by a voltage V which, in standby periods, corresponds to voltage VBAT and which, outside standby periods, is not modified with respect to a usual NFC interface, that is, corresponds to voltage VBAT in reader mode and to the voltage extracted from the detected field in card mode.

Circuit 56 may remain powered with the power sampled form the detected field, since it is not used in standby mode.

Apart from the above-mentioned circuits, the other circuits of the NFC interface are preferably not modified. In particular, the interface always comprises a digital-to-analog converter supplying a set point signal to the PTIC when the interface is active (outside standby periods). The converter may reuse register 77 and circuit 79.

An advantage of the described embodiment is that they enable to adjust the tuning of the resonant circuit of the NFC interface, including during standby periods.

Another advantage of the described embodiments is that they enable to have, during standby periods, a setting of the tuning corresponding to the last measured tuning, which improves the field detection.

Another advantage of the described embodiments is that they do not modify the protocols of communication between devices.

Various embodiments have been described. Various alterations, modifications, and improvements will readily occur to those skilled in the art. In particular, the selection of the number of switches K and of the size of register 77 may vary from one application to another. Further, the practical implementation of the embodiments which have been described is within the abilities of those skilled in the art by using on the functional indications given hereinabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A near-field communication circuit comprising: an oscillating circuit having a controllable capacitor; a control circuit coupled to the oscillating circuit to control the controllable capacitor; and a battery coupled to the control circuit to enable control when the near-field communication circuit is in a standby mode, wherein the control circuit is configured to control the controllable capacitor based on stored data representative of a frequency tuning of the oscillating circuit based on a measurement performed before the circuit is set to standby; wherein the control circuit is further configured to control a controllable resistive dividing bridge according to the stored data.

2. The circuit of claim 1, wherein the control circuit comprises a controllable resistive dividing bridge powered by the battery and having an output to control the controllable capacitor.

3. The circuit of claim 2, wherein the control circuit further comprises a latch circuit coupled to the battery, the latch circuit configured to control the controllable resistive dividing bridge.

4. The circuit of claim 3, wherein the control circuit further comprises a register, wherein the stored data are stored in the register.

5. The circuit of claim 4, wherein the register includes a plurality of bits, states of the bits conditioning states supplied by the latch circuit.

6. The circuit of claim 2, wherein the controllable resistive dividing bridge comprises:
a first resistor connected between a first terminal of application of a voltage supplied by the battery and an output terminal connected to a control terminal of the controllable capacitor; and second resistors, each second resistor in series with a switch between the output terminal and a second terminal of application of the voltage supplied by the battery.

7. The circuit of claim 1, wherein the stored data are obtained from an analysis of an amplitude and phase of a signal across the oscillating circuit.

8. A method of controlling a controllable capacitor of an oscillating circuit of a near-field communication circuit, the method comprising: measuring a frequency tuning of the oscillating circuit; storing data representative of the frequency tuning of the oscillating circuit; after storing the data, entering a standby mode of the near-field communication circuit; and during the standby mode, controlling the controllable capacitor according to the data stored before the near-field communication circuit entered the standby mode; wherein controlling the capacitor comprises controlling a controllable resistive dividing bridge that is powered by a battery during the standby mode.

9. The method of claim 8, wherein storing the data comprises storing the data in a register.

10. The method of claim 9, wherein controlling the controllable capacitor comprises latching the data into a latch circuit and configuring a resistive dividing bridge using the latch circuit.

11. The method of claim 10, wherein the latch circuit and the resistive dividing bridge are powered by a battery during the standby mode.

12. The method of claim 8, wherein measuring the frequency tuning of the oscillating circuit comprises analyzing an amplitude and phase of a signal across the oscillating circuit.

13. The method of claim 8, wherein the controllable resistive dividing bridge comprises: a first resistor connected between a first terminal of application of a voltage supplied by a battery and an output terminal connected to a control terminal of the controllable capacitor; and second resistors, each second resistor in series with a switch between the output terminal and a second terminal of application of the voltage supplied by the battery.

14. A near-field communication device comprising:
an RF interface;
an oscillating circuit having a controllable capacitor coupled to the RF interface;
a controllable resistive dividing bridge having an output coupled to the controllable capacitor;
a latch circuit having an output coupled to the controllable resistive dividing bridge;
a register having an output coupled to an input of the latch circuit;
an analysis circuit coupled to the RF interface, the analysis circuit having an output coupled to the register; and
a battery coupled to the controllable resistive dividing bridge and the latch circuit, wherein the controllable capacitor is configured to be controlled based on data representative of a frequency tuning of the oscillating circuit based on a measurement performed before the near-field communication device is set to a standby mode, the battery configured to power the controllable resistive dividing bridge and the latch circuit in the standby mode.

15. The device of claim 14, further comprising an antenna coupled to the RF interface.

16. The device of claim 14, wherein the device is a mobile communication device.

17. A near-field communication device comprising:
an RF interface;
an oscillating circuit having a controllable capacitor coupled to the RF interface;
a controllable resistive dividing bridge having an output coupled to the controllable capacitor;
a latch circuit having an output coupled to the controllable resistive dividing bridge;
a register having an output coupled to an input of the latch circuit;
an analysis circuit coupled to the RF interface, the analysis circuit having an output coupled to the register; and
a battery coupled to the controllable resistive dividing bridge and the latch circuit, wherein the controllable resistive dividing bridge comprises:
a first resistor connected between a first terminal of application of a voltage supplied by the battery and an output terminal connected to a control terminal of the controllable capacitor; and
second resistors, each second resistor in series with a switch between the output terminal and a second terminal of application of the voltage supplied by the battery.

* * * * *